United States Patent
Yow et al.

(10) Patent No.: US 9,646,853 B1
(45) Date of Patent: May 9, 2017

(54) IC DEVICE HAVING PATTERNED, NON-CONDUCTIVE SUBSTRATE

(71) Applicant: FREESCALE SEMICONDUCTOR, INC., Austin, TX (US)

(72) Inventors: Kai Yun Yow, Petaling Jaya (MY); Poh Leng Eu, Petaling Jaya (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/883,638

(22) Filed: Oct. 15, 2015

(51) Int. Cl.
*H01L 23/48* (2006.01)
*H01L 23/52* (2006.01)
*H01L 29/40* (2006.01)
*H01L 21/48* (2006.01)
*H01L 23/498* (2006.01)

(52) U.S. Cl.
CPC ........ *H01L 21/486* (2013.01); *H01L 21/4853* (2013.01); *H01L 23/49811* (2013.01); *H01L 23/49827* (2013.01); *H01L 23/49866* (2013.01)

(58) Field of Classification Search
CPC ............. H01L 21/486; H01L 23/49866; H01L 21/4853; H01L 23/49827; H01L 23/49811
See application file for complete search history.

(56) References Cited

U.S. PATENT DOCUMENTS

| | | |
|---|---|---|
| 6,022,758 A | 2/2000 | Badehi |
| 6,569,248 B1 | 5/2003 | Hertz |
| 8,778,735 B1 | 7/2014 | Xue et al. |
| 8,841,758 B2 | 9/2014 | Daniels et al. |
| 9,508,687 B2 * | 11/2016 | Desai ................. H01L 23/49531 |
| 2009/0057858 A1 * | 3/2009 | Ming Wang .......... H01L 21/568 257/677 |
| 2011/0074024 A1 * | 3/2011 | Pendse .................. H01L 21/563 257/737 |
| 2012/0018498 A1 | 1/2012 | Zhong et al. |
| 2013/0043573 A1 | 2/2013 | Williams |
| 2013/0065361 A1 * | 3/2013 | Shen ................... H01L 23/4952 438/113 |
| 2013/0075924 A1 * | 3/2013 | Lin ........................ H01L 24/19 257/774 |
| 2014/0175665 A1 | 6/2014 | Kang |
| 2014/0374901 A1 * | 12/2014 | Huishu ................... H01L 23/60 257/737 |
| 2015/0001708 A1 * | 1/2015 | Lin ........................ H01L 25/50 257/737 |

* cited by examiner

*Primary Examiner* — Victor A Mandala
(74) *Attorney, Agent, or Firm* — Charles E. Bergere

(57) ABSTRACT

A patterned, non-conductive substrate for an integrated circuit (IC) package has a die side configured to receive a die and a lead side opposite the die side. A pattern formed in the substrate defines openings (e.g., holes, steps, grooves, and/or cavities) that extend between the die side and the lead side of the substrate. In the IC package, the openings are filled with conductive material (e.g., solder) that supports electrical connections between bond pads on the die and leads formed from the conductive material. The substrate can be used to form a relatively inexpensive, quad flat no-lead (QFN) IC package without using a metal lead frame and without bond wires.

10 Claims, 9 Drawing Sheets

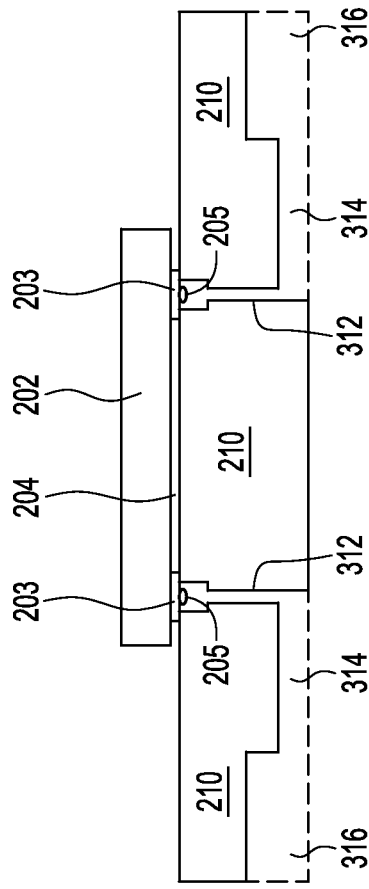
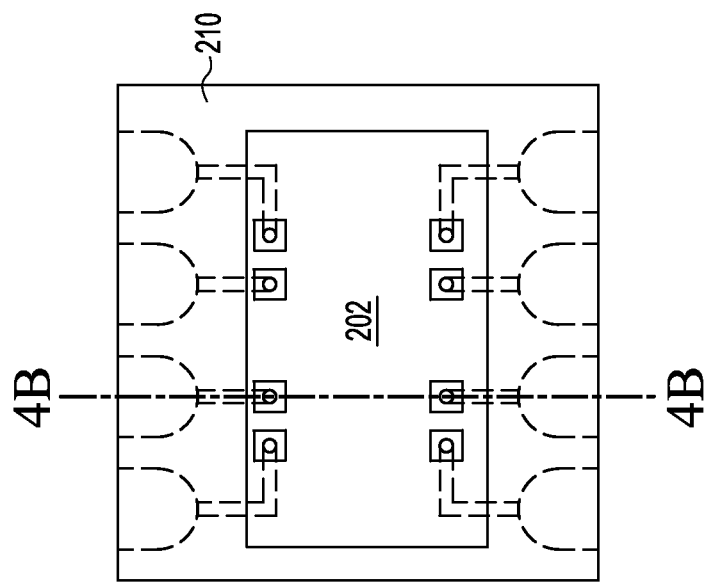
FIG. 4B
FIG. 4A

500

500

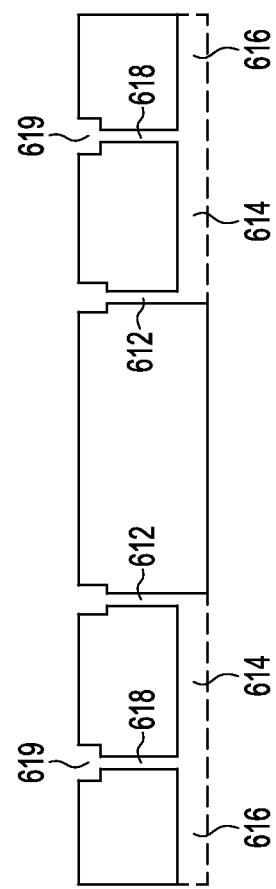
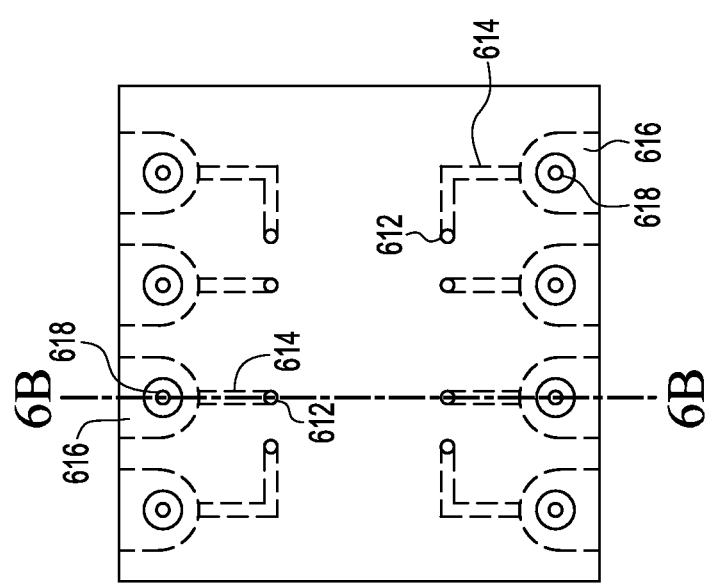
FIG. 6B
FIG. 6A

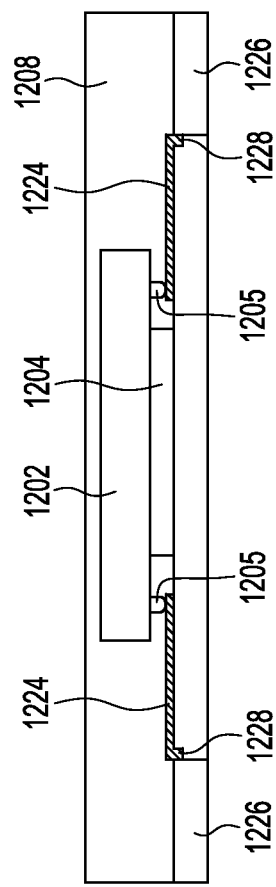
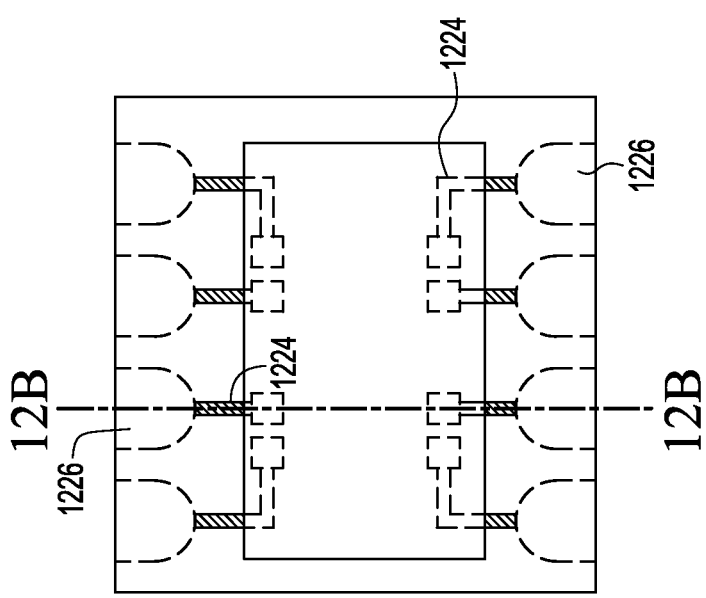
FIG. 12B
FIG. 12A

US 9,646,853 B1

IC DEVICE HAVING PATTERNED, NON-CONDUCTIVE SUBSTRATE

BACKGROUND

The present invention relates to integrated circuit (IC) packaging and, more particularly, an IC package assembled using a preprinted substrate.

FIG. 1 is a cross-sectional side view of a conventional, quad-flat no-lead (QFN), packaged IC device 100. The IC package 100 includes an IC die 102 mounted on a die pad 112 of a metal lead frame 110 using a suitable die-attach material 104 (e.g., tape or epoxy). The die 102 is connected to leads 114 of the lead frame 110 with bond wires 106. The die 102, bond wires 106, and upper surfaces of the lead frame 110 are encapsulated with a non-conductive molding compound 108. The leads 114 are partially exposed for electrical connection to another device or a printed circuit board. Although the design of the IC package 100 is satisfactory for many applications, it is desirable to design an alternative IC package that is less expensive to assemble, while providing the same functionality as the IC package 100.

BRIEF DESCRIPTION OF THE DRAWINGS

Embodiments of the invention will become more fully apparent from the following detailed description, the appended claims, and the accompanying drawings in which like reference numerals identify similar or identical elements.

FIG. 4A is an X-ray, top plan view of a sub-assembly that exists after a die has been mounted active-side-down on a die side of the substrate of FIG. 2;

FIG. 4B is a cross-sectional side view of the sub-assembly of FIG. 4A along line 4B-4B;

FIG. 6A is an X-ray, top plan view of a substrate according to an alternative embodiment of the invention;

FIG. 6B is a cross-sectional side view of the substrate of FIG. 6A along line 6B-6BA;

FIG. 12A is an X-ray, top plan view of an IC package according to another embodiment of the invention; and FIG. 12B is a cross-sectional side view of the IC package of FIG. 12A along line 12B-12BA.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention provides a packaged integrated circuit comprising a patterned, non-conductive substrate. The substrate has a die side configured to receive a die and a lead side opposite the die side. The pattern of the substrate defines openings that extend between the die side and the lead side of the substrate. The openings are filled with conductive material, such as solder, that supports electrical connections between bond pads on the die and leads formed from the conductive material.

In another embodiment, the present invention provides a method for assembling an IC package. The method comprises (a) providing a substrate having a die side configured to receive a die and a lead side opposite the die side, wherein the substrate is patterned and the pattern defines openings that extend between the die side and the lead side; (b) mounting a die on the substrate die side, wherein bond pads of the die face the substrate die side; and (c) applying a conductive material to fill in the openings to form leads of the IC package and to connect the leads with the die bond pads.

Figure 1:
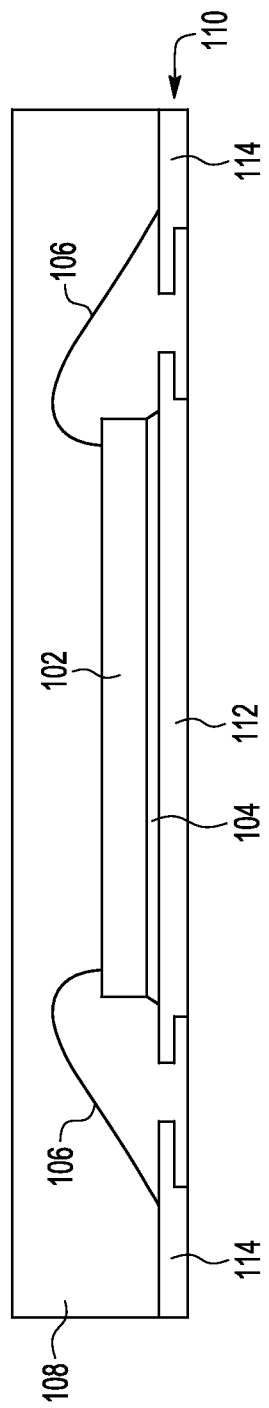
FIG. 1 is a cross-sectional side view of a conventional IC package.
Figure 2B:
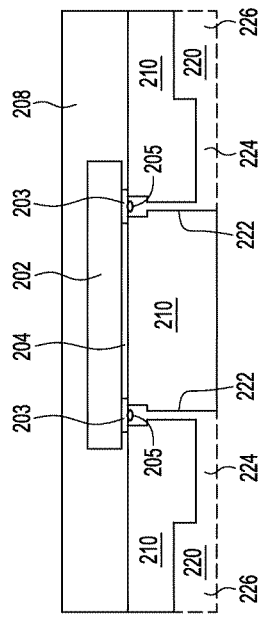
FIG. 2B is a cross-sectional side view of the IC package of FIG. 2A along line 2B-2B.
Figure 2A:
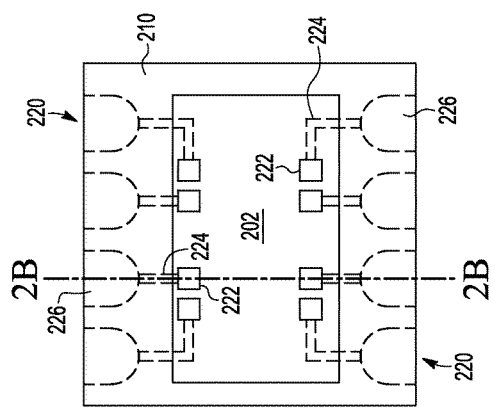
FIG. 2A is an X-ray, top plan view of a QFN IC package according to one embodiment of the invention.

Referring now to FIG. 2A, an X-ray, top plan view of a QFN IC package 200 according to one embodiment of the invention is shown. FIG. 2B is a cross-sectional side view of the IC package 200 along the corresponding cut-line of FIG. 2A. The IC package 200 may function in a substantially identical manner as the IC package 100 of FIG. 1, but, as described further below, can be assembled less expensively than the IC package 100.

The IC package 200 comprises an IC die 202 mounted onto the die side of a patterned, non-conductive substrate 210 using a suitable die-attach material 204 (e.g., tape or epoxy). The patterned substrate 210 has eight conductive (e.g., metal) elements 220 formed within holes, grooves, and cavities in the patterned substrate 210. Each conductive element 220 comprises a vertical via structure 222 connected to a horizontal routing structure 224 connected to a lead structure 226 that functions as an exposed lead of the QFN IC package 200. Conductive (e.g., copper or other metal) bumps 205 provide electrical interconnections between bond pads 203 on the active surface of the IC die 202 and the via structures 222 of the conductive elements 220. The die 202 and the top surface (as shown in FIG. 2B) of the substrate 210 are encapsulated within a suitable, non-conducting, molding compound 208.

The die 202 may comprise any type of integrated circuit, such as an application specific IC (ASIC), a microprocessor, a sensor, etc., and the present invention is not limited by the type of die.

In certain implementations, the substrate 210 is made of a suitable plastic, such as Bismaleimide Triazine (BT) resin, Polyimide, or a pre-molded compound such as G770HC or G700LTD molding compound from Sumitomo Corporation of Japan. The conductive elements 220 are made of a suitable metal, such as SW100 solder from Tatsuta Electronic Materials of Taiwan. The die attach material 204 is made of a suitable adhesive, such as tape, FH-9011 Die Attach Film (DAF) from Hitachi, Ltd., of Japan, or Ablebond 2025JR epoxy from Henkel Electronics Materials of Belgium. The conductive bumps 205 are made of a suitable metal, such as copper. The die bond pads 203 are made of a suitable metal, such as NiPdAu or copper. The molding compound 208 is made of a suitable insulating material, such as epoxy.

Because the IC package 200 is assembled without a conventional metal lead frame, such as lead frame 110 of FIG. 1, and without conventional bond wires, such as bond wires 106 of FIG. 1, the IC package 200 can be assembled less expensively than the IC package 100 of FIG. 1.

Figure 5B:
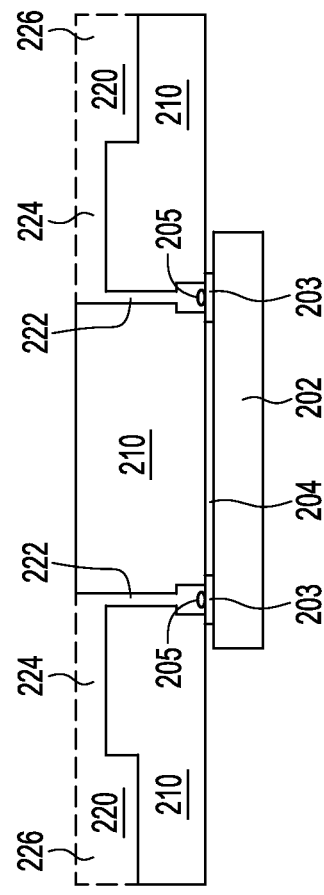
FIG. 5B is a cross-sectional side view of the sub-assembly of FIG. 5A along line 5B-5B.

FIGS. 3-5 illustrate a method of assembling the IC package 200 of FIG. 2 in accordance with a preferred embodiment of the invention.

Figure 3B:
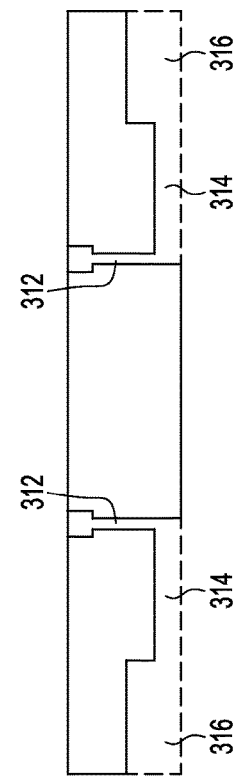
FIG. 3B is a cross-sectional side view of the substrate of FIG. 3A along line 3B-3B.
Figure 3A:
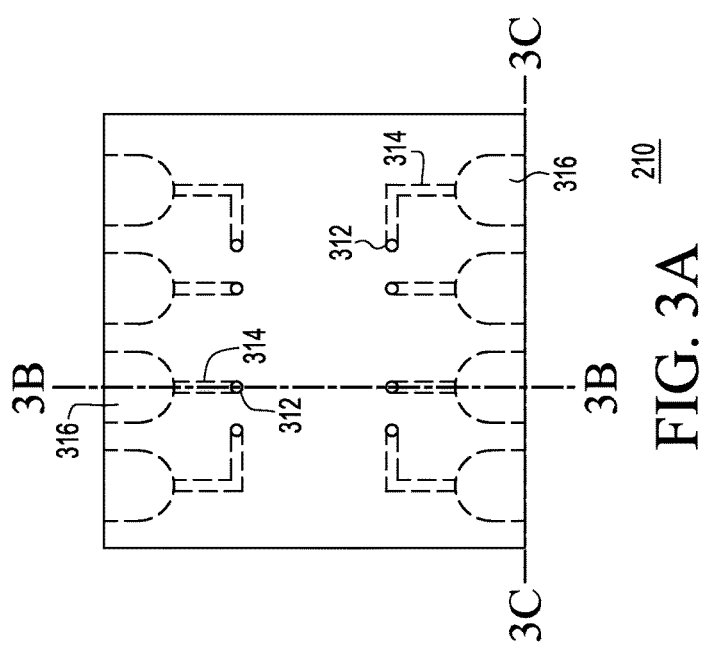
FIG. 3A is an X-ray, top plan view of the patterned, non-conductive substrate of FIG. 2.
Figure 3C:
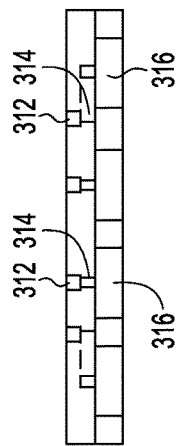
FIG. 3C is an cross-sectional side view of the substrate of FIG. 3A.

FIG. 3A is an X-ray, top plan view of the patterned, non-conductive substrate 210 of FIG. 2. FIG. 3B is a cross-sectional side view of the substrate 210 along the corresponding cut-line of FIG. 3A, and FIG. 3C is an X-ray, side view of the corresponding side of the substrate 210 of FIG. 3A. As shown in FIGS. 3A-3C, the substrate 210 has a pattern of holes 312, grooves 314, and cavities 316 respectively corresponding to the via structures 222, the routing structures 224, and the lead structures 226 of the patterned substrate 210 of FIG. 2. The patterned, non-conductive substrate 210 may be fabricated using any suitable technique, such as by molding, micro drilling, or mechanical routing.

FIG. 4A is an X-ray, top plan view of a sub-assembly 400 that exists after the die 202 has been mounted active-side-down onto the die side of the substrate 210 of FIG. 2. FIG. 4B is a cross-sectional side view of the sub-assembly 400 along the corresponding cut-line of FIG. 4A. Note that the die 202 already has the bumps 205 formed on the die's bond pads 203 before the die 202 is mounted onto the substrate 210. As shown in FIG. 4B, the bond pads 203 and bumps 205 coincide with the holes 312 in the substrate 210.

Figure 5A:
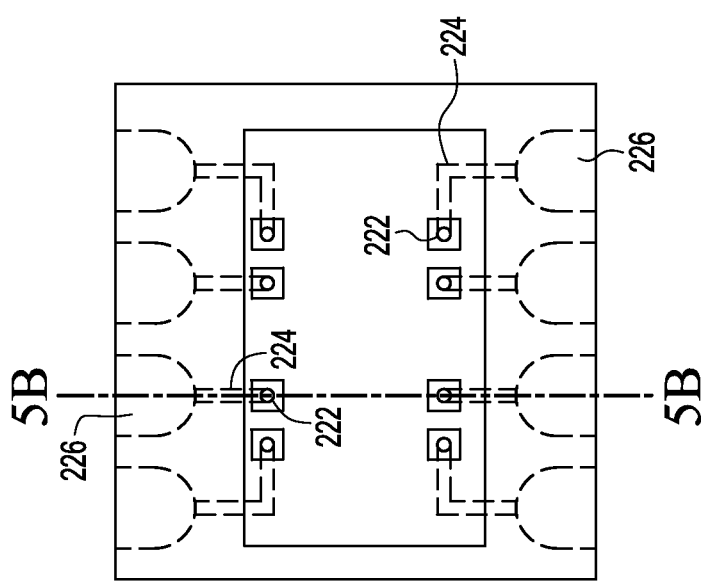
FIG. 5A is an X-ray, top plan view of a sub-assembly that exists after the sub-assembly of FIG. 4 has been flipped over and conductive material has been applied to fill holes, grooves, and cavities of the patterned substrate.

FIG. 5A is an X-ray, top plan view of a sub-assembly 500 that exists after the sub-assembly 400 of FIG. 4 has been flipped over and conductive material (e.g., solder) has been applied (e.g., by screen printing) to fill the holes 312, the grooves 314, and the cavities 316 of the patterned substrate 210, thereby respectively forming the via structures 222, the routing structures 224, and the lead structures 226 of the conductive elements 220 of FIG. 2. Note that the bumps 205 help to prevent the solder from flowing onto the die side of the substrate 210. When the bond pads 203 are made of a solder-resistant material, such as aluminum, using copper or gold for the bumps 205 supports solder attachment.

FIGS. 2A and 2B represents the final assembly of the IC package 200 after the sub-assembly 500 of FIG. 5 has been flipped over, and the molding compound 208 has been applied over the die side of the substrate 210 to encapsulate the die 202.

FIG. 6A is an X-ray, top plan view of the patterned, non-conductive substrate 610 according to an alternative embodiment of the invention. FIG. 6B is a cross-sectional side view of the substrate 610 along the corresponding cut-line of FIG. 6A. Substrate 610 is analogous to substrate 210 of FIGS. 2-5 with analogous elements having analogous labels. In addition, for each corresponding set of a hole 612, a groove 614, and a cavity 616, substrate 610 also has an additional hole 618 extending from the cavity 616 to a relatively wide opening 619 at the other side of the substrate 610. These additional holes 618 with their wide openings 619 enable conductive elements (analogous to the conductive elements 220 of FIG. 2) to be formed for the resulting IC packages that are more securely anchored within the substrate 610. In particular, when filled with solder to form one of the conductive elements, the portion of the solder filling the relatively wide opening 619 helps to anchor the conductive element within the substrate 610. Those skilled in the art will understand that other suitable designs for cavities will also provide a similar anchoring or retention function.

Figure 7:
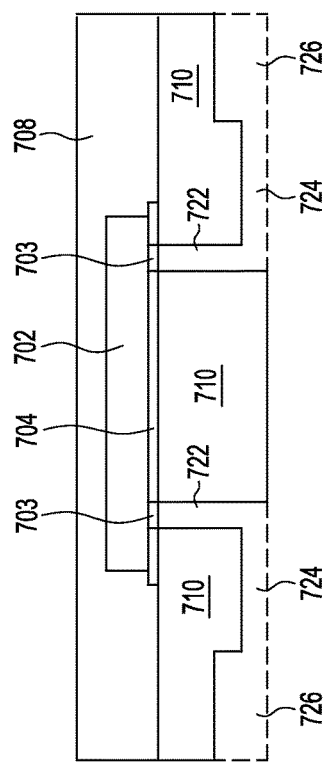
FIG. 7 is a cross-sectional side view of an IC package according to another embodiment of the invention.

FIG. 7 is a cross-sectional side view of an IC package 700 according to another embodiment of the invention. IC package 700 is similar to IC package 200 of FIG. 2 with analogous elements labeled analogously, except that, in IC package 700, there are no conductive bumps, analogous to bumps 205 of FIG. 2, mounted onto the die pads 703 of the die 702. Instead, in IC package 700, the substrate via structures 722 directly contact the die's bond pads 703. In order to support solder attachment, the bond pads 703 are formulated with a top layer of a suitable material, such as (without limitation) NiAu, Cu, or NiPdCu.

Figure 8A:
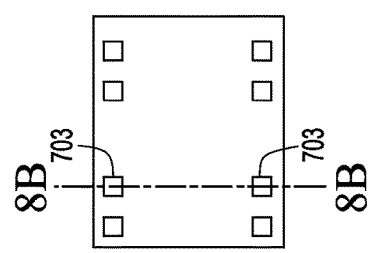
FIG. 8A is a top plan view of an active side of the die of FIG. 7.
Figure 8B:
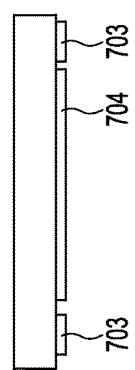
FIG. 8B is a cross-sectional side view of the die of FIG. 8A along line of FIGS. 8B-8B.

FIG. 8A is a top plan view of the die 702 of FIG. 7, and FIG. 8B is a cross-sectional side view of the die 702 along the corresponding cut-line of FIG. 8A. As shown in the figures, the die pads 703 of the die 702 have no conductive bumps. FIG. 8B also shows the die-attach material 704 used to secure the die 702 onto the substrate 710 of FIG. 7.

Figure 9:
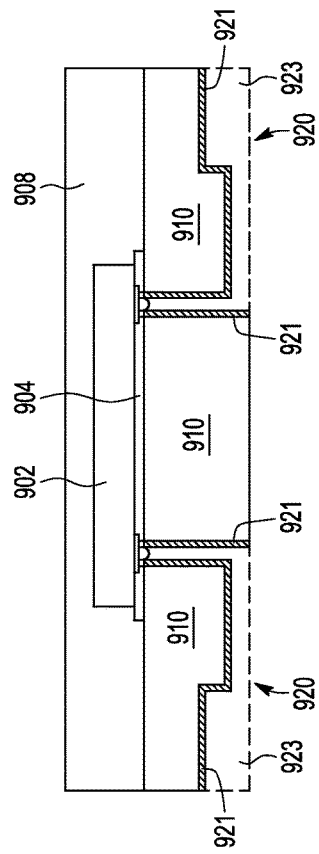
FIG. 9 is a cross-sectional side view of an IC package according to another embodiment of the invention.

FIG. 9 is a cross-sectional side view of an IC package 900 according to another embodiment of the invention. In this embodiment, the conductive elements 920 are formed by sequentially applying two different materials onto and into the patterned substrate 910: first, a layer of paste, such as SW100 conductive paste by Tatsuta Electronic Materials of Taiwan, is applied to form a relatively thin coating 921 on the surfaces of the holes, grooves, and cavities before filling the rest of those volumes with solder 923. The thin coating of paste may improve the retention of the conductive elements 920 within the substrate 910 by improving the bonding between the solder 923 and the substrate 910. Still other embodiments may involve the sequential application of three or more different materials to form the conductive elements.

Figure 10:
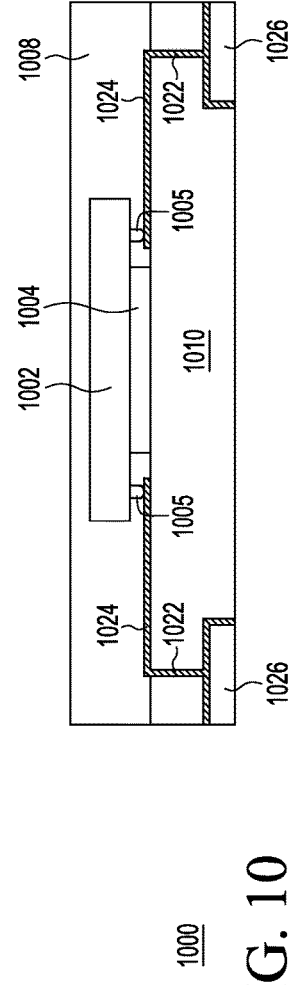
FIG. 10 is a cross-sectional side view of an IC package according to another embodiment of the invention.

FIG. 10 is a cross-sectional side view of an IC package 1000 according to another embodiment of the invention. IC package 1000 is similar to IC package 200 of FIG. 2 with analogous elements labeled analogously, except that, in IC package 1000, (i) the via structures 1022 and the routing structures 1024 are formed of conductive paste, while the lead structures 1026 are formed by applying solder over a coating of the conductive paste, (ii) the via structures 1022 are connected between the corresponding lead structures 1026 and the corresponding routing structures 1024, (iii) the routing structures 1024 are applied on top of the die side of the substrate 1010, and (iv) the routing structures 1024 are directly connected to the conductive bumps 1005. Note that, since the bumps 1005 do not coincide with the via structures 1022, the die 1002 sits higher above the die side of the substrate 1010 and the die-attach material 1004 is thicker than the analogous elements of IC package 200.

Figure 11:
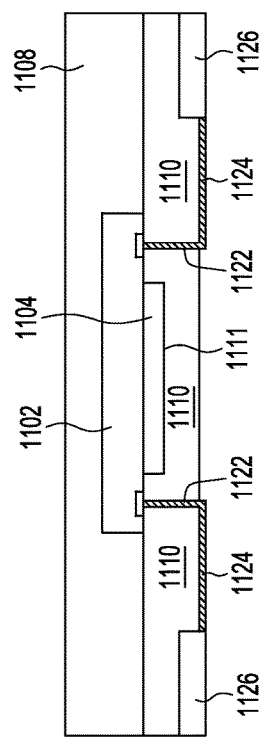
FIG. 11 is a cross-sectional side view of an IC package according to another embodiment of the invention.

FIG. 11 is a cross-sectional side view of an IC package 1100 according to another embodiment of the invention. IC package 1100 is similar to IC package 700 of FIG. 7 with analogous elements labeled analogously, except that, in IC package 1100, (i) the via structures 1122 and the routing structures 1124 are formed of conductive paste, while the lead structures 1126 are formed of solder and (ii) the routing structures 1124 are applied onto the lead side of the substrate 1110. Also, in IC package 1100, the die attach material 1104 resides in a recess 1111 on the die side of the substrate 1110, such that the die 1102 sits lower onto the die side of the substrate 1110.

FIG. 12A is an X-ray, top plan view of an IC package 1200, according to one embodiment of the invention. FIG. 12B is a cross-sectional side view of the IC package 1200 along the corresponding cut-line of FIG. 12A. IC package 1200 is similar to IC package 1000 of FIG. 10 with analogous elements labeled analogously, except that, in IC package 1200, there are no via structures analogous to structures 1022 of FIG. 10. Instead, IC package 1200 has small (conductive paste) step structures 1228 that provide the electrical connections between the corresponding (solder) lead structures 1226 and the corresponding (conductive paste) routing structures 1224.

Although the invention has been described in the context of specific embodiments, the invention is not so limited. Those skilled in the art will understand that the invention also includes other embodiments having different combinations of some or all of the following feature options. The IC package may be with or without conductive bumps on the die bond pads. The routing structures may be located within grooves in the substrate or on the surface of the substrate, and either on the die side or the lead side. The substrate may be with or without vertical via structures that extend therethrough. The IC package may have die-attach material applied on the die side of the substrate or within a recess on the die side of the substrate. Conductive elements may be with or without solder-anchoring structures, and the conductive elements may be formed from a single conductive material or by sequentially applying two or more different materials.

Although the invention has been described in the context of IC packages having eight leads for a single die having eight bond pads, it will be understood that the invention can be implemented in the context of IC packages having one or more dies having any suitable numbers of leads and die bond pads.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The invention claimed is:

1. An integrated circuit package, comprising:
   a non-conductive substrate having a die side configured to receive an IC die and a lead side opposite the die side,
   a pattern formed on the substrate, wherein the pattern defines openings that extend between the die side and the lead side of the substrate, and wherein the openings comprise a plurality of holes that extend vertically from the lead side to the die side;
   an IC die having an active side with bond pads, wherein the die is mounted on the die side of the substrate, and wherein the bond pads and the holes are in direct contact and vertically aligned with each other; and
   a conductive material that fills the openings in the substrate and defines leads on the lead side of the substrate, and forms electrical connections between the die bond pads and the leads, and
   wherein the openings in the substrate further comprise a plurality of cavities on the lead side of the substrate filled with the conductive material to form the leads of the IC package.

2. The integrated circuit package of claim 1, wherein the active side of the die faces the die side of the substrate.

3. The integrated circuit package of claim 2, wherein no bond wires connect the die bond pads and the leads of the IC package.

4. The integrated circuit package of claim 2, further comprising a molding compound that covers the die and the die side of the substrate.

5. The integrated circuit package of claim 2, further comprising conductive bumps formed on the die bond pads, wherein the conductive bumps support electrical connection between the bond pads and corresponding ones of the leads.

6. The integrated circuit package of claim 2, wherein no conductive bumps are formed on the die bond pads.

7. The integrated circuit package of claim 1, wherein:
the openings in the substrate further comprise a plurality of grooves, each groove connecting a hole with a corresponding cavity;
the die bond pads coincide with the holes such that the conductive material filling the holes forms electrical connections to the die bond pads; and
the conductive material that fills the grooves supports the electrical connections between the die bond pads and the package leads.

8. The integrated circuit package of claim 1, wherein:
each hole coincides with a corresponding cavity; and
conductive traces formed on the substrate die side electrically connect the die bond pads and the conductive material filling the corresponding holes.

9. The integrated circuit package of claim 1, wherein:
the die bond pads coincide with the holes such that the conductive material filling the holes forms electrical connections to the die bond pads; and
conductive traces formed on the substrate lead side electrically connect the conductive material filling the holes and the package leads.

10. The integrated circuit package of claim 1, wherein the conductive material comprises solder.

\* \* \* \* \*